United States Patent [19]

Einzig et al.

[11] Patent Number: 4,868,495
[45] Date of Patent: Sep. 19, 1989

[54] FIBER OPTIC

[75] Inventors: Robert E. Einzig; Charles M. Davis; Clarence J. Zarobila, all of Herndon, Va.

[73] Assignee: Optical Technologies, Inc., Herndon, Va.

[21] Appl. No.: 327,359

[22] Filed: Mar. 23, 1989

Related U.S. Application Data

[63] Continuation of Ser. No. 141,000, Jan. 5, 1988, abandoned.

[51] Int. Cl.$^4$ ............................................. G01R 00/00
[52] U.S. Cl. ................................... 324/97; 324/263; 350/96.14; 330/4.3
[58] Field of Search .................. 367/156, 159, 168; 324/96, 97, 263; 250/221, 231 R; 350/96.13, 96.14; 356/345; 332/7.51

[56] References Cited

U.S. PATENT DOCUMENTS

| | | | |
|---|---|---|---|
| 2,631,271 | 3/1953 | Thuras | 367/156 |
| 4,471,300 | 9/1984 | Harnder et al. | 324/96 |
| 4,516,021 | 5/1985 | Taylor | 250/227 |
| 4,609,871 | 9/1986 | Bobb | 250/227 |
| 4,622,460 | 11/1986 | Failes et al. | 250/227 |
| 4,675,522 | 6/1987 | Arunkumar | 250/227 |

OTHER PUBLICATIONS

Rand et al, "Interferometric Fiber-optic Magnetometers", Proc. Sensor Expo, 9/15-17, 1987, pp. 263-269; Abst only provided.

Davis et al., "An Introduction to Fiberoptic Sensors", Laser Focus, vol. 18, #2, pp. 112-115, 2/82; Abst. only.

Primary Examiner—Nelson Moskowitz
Attorney, Agent, or Firm—Kerkam, Stowell, Kondracki, & Clarke

[57] ABSTRACT

A single mode optical fiber is used to detect electrical currents or magnetic fields from a source to a high degree of accuracy. Phase modulation of an optical beam is used to determine the changes of physical properties of a magnetostrictive material which jackets the fiber or around which the fiber is wound. An electromagnetic field, such as that emanating from a high intensity field wire, is measured by the device which acts as a current transformer and meters peak-to-peak electric currents of approximately 10,000 amperes or more with accuracy exceeding 0.1%. The invention structure of the device provides advantages such as operation safety, EMI immune leads, low cost, light weight, and dielectric construction among others.

10 Claims, 2 Drawing Sheets

FIBER OPTIC

This is a continuation of application Ser. No. 141,000, filed Jan. 5, 1988, now abandoned.

BACKGROUND OF THE INVENTION

1. Field of the Invention

The present invention relates generally to metering devices for electric current and more particularly, to current metering devices utilizing fiber optic techniques to measure the amount of current passing through a conductor.

2. Background Art

The possibility of sensing magnetic fields by the use of optical fibers has long been recognized, and several types of fiber optic magnetic sensors are known. The most successful and sensitive such magnetic sensing devices utilize the magnetostrictive properties of metal alloys. Areas of use for very sensitive magnetic field sensors has been in the field of magnetometer design to measure magnetic fields, and transformers, where a reliable and sensitive measurement of magnetic field strength provides an accurate indicator of the amount of electric current being conducted by a conductor. The use of magnetostriction and its properties have been well documented.

Magnetostriction is defined as the change in dimension of a ferromagnetic material when it is subjected to a magnetic field. The magnetostriction may be positive or negative depending on the material and its composition. For example, pure nickel displays negative magnetostriction, whereas iron-nickel alloys, having less than forty-five percent nickel, display positive mangetostriction. Moreover, data for 42-permalloy, which is an alloy of forty-two percent nickel and fifty-eight percent iron, has been shown to be about 3.5 times as sensitive as nickel alone. A study of the magnetostrictive properties of various materials may be found in an article in *Applied Optics*, Volume 19, No. 22 to Jarzynski et al, one of the authors being C. M. Davis, Jr., one of the inventors herein, which was published Nov. 15, 1980, and entitled "Magnetic Field Sensitivity of an Optical Fiber with Magnetostrictive Jacket".

The broad concept of impressing a phase modulation onto a fiber optic cable is also known in the art. Modulating means, such as a magnetostrictive element, may be coupled to the fiber without breaking the fiber. In fiber optic magnetic sensors, a single mode optical fiber is bonded to a magnetostricitive element or sheathed by a magnetostrictive jacket, either of which may undergo a longitudinal strain when a magnetic field is applied. This strain is transmitted to the optical fiber and effects the phase delay of a laser light beam propagating through the fiber. Phase changes in the optical fiber created by the strain can be detected using currently available technologies, and the strength of the magnetic field can thus be determined. Devices have been developed which can measure either very strong magnetic fields or alternatively very weak magnetic field on the order of $10^{-5}$ and $10^{-8}$ gauss.

In the field of high intensity electric current measurement, various means have been used in the past to measure electric current passing through a conductor. Conventional means such as Hall effect gauges, shunt type current measuring devices, etc., are difficult and sometimes dangerous to use, and are liable to vary considerably sometimes up to ten percent, from the actual current being conducted. Other devices, such as the one disclosed by U.S. Pat. No. 4,542,338, to Arditty et al, require continual electrical attachment to the conductor in which the current is being measured. Moreover, even the Arditty et al device fails to measure the electric current conducted in the intensity ranges presently utilized.

Other devices, such as U.S. Pat. Nos. 4,348,587 and 4,622,460 can detect magnetic fields of very small magnitudes, but are not usable to detect magnetic fields created by high intensity current conductors such as electric power cables. The difficulty heretofore has been the provision of a relatively simple, inexpensive yet highly accurate magnetostrictive sensor described which is capable of sensing magnetic fields created by a conductor carrying current in a range, for example, of from five to ten thousand amperes with an accuracy exceeding 0.1 percent.

A further drawback to the measuring transformer devices presently known concerns the installation of the devices which are difficult and sometimes dangerous to install and dismantle. This has led to devices which are permanently affixed to the conductors in which the current is being measured.

Magnetostrictive materials, like all ferromagnetic materials, exhibit hysteresis to some extent. Hysteresis is the residual material magnetization of a ferromagnetic material which remains upon the removal of a magnetic field and which only dissipates with time. As a result, hysteresis can influence the accuracy of a magnetostrictive measuring device. What is required is a device which can compensate for the effects of hysteresis and produce accurate measurements.

SUMMARY OF THE INVENTION

One object of the present invention is to obviate the difficulties encountered with the previously known devices.

Another object is to provide for a safe, non-explosive, inexpensive current transformer for measuring the electric current passing through a conductor.

Still another object of the present invention is to provide a fiber optic current transformer which is accurate to better than 0.1 percent error for a range of currents in a conductor which may extend from approximately five amperes to ten thousand amperes for a particular fiber length.

Yet another object of the present invention is to provide such a fiber optic current transformer which is not frequency limited and does not need a dc bias.

Another advantage of the present invention is its reliability, its accuracy of less than 0.1 percent error, and its ability to be used with conductors having a current intensity up to ten thousand amperes.

Still another object and significant advantage of the present invention is the ability to install and remove a current transformer onto a high intensity, high voltage conductor safely, expeditiously and without necessitating connections to a live wire.

Another advantage of the present invention is its low cost and its ability to detect distortions of the current waveform.

A feature of the present invention allowing for its easy installation and removal from a high intensity conductor is a magnetostrictive element having a toroidal shape with a cut through slot for passage of the conductor into the interior thereof.

Still another feature of the invention is the use of an interferometer utilizing single mode optical fibers which are tightly wound around a magnetostrictive element and are phase modulated to produce highly accurate magnetic field sensing and measurement.

In accordance with these objects, advantages, and features of the present invention, disclosed herein is a fiber optic sensor employing magnetic field detection. Further disclosed is a current transformer utilizing such a fiber optic sensor in a phase modulated single mode fiber optic interferometer. The magnetostrictive element of the invention measures magnetic fields and comprises a tubular placement having a slot along its length. Its shape allows ingress and egress of a conductor such as an electrical cable. The shape also provides a demagnetizing effect so as to efficiently and safely measure the magnetic field of the conductor while minimizing the effect of the hysteresis of the magnetostrictive material.

BRIEF DESCRIPTION OF THE DRAWINGS

The invention will now be further described, by way of an illustrating and non-limiting example, with reference to the accompanying drawings, in which the same reference numerals denote the same components in all the figures, and in which.

DETAILED DESCRIPTION OF THE INVENTION

Figure 1:
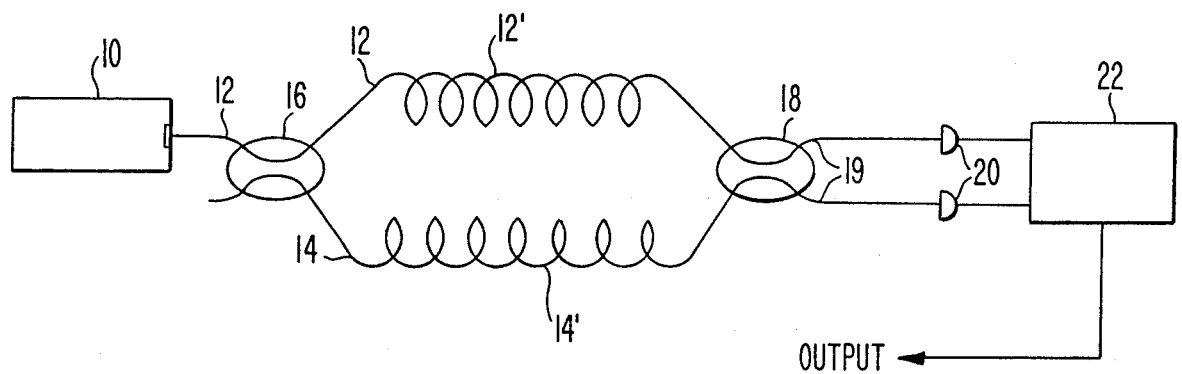
FIG. 1 is a schematic representation of a conventional Mach-Zehnder interferometer.

Referring now to FIG. 1, a conventional fiber optic Mach-Zehnder interferometer is illustrated, comprising a beam source 10 such as laser, a first optical arm 12 and a second optical arm 14, input coupling means 16 and output coupling means 18, photodetectors 20, and fringe counting electronics 22 electrically connected to an output (not shown). Although a Mach-Zehnder interferometer has been shown in FIG. 1 as the means for converting phase modulation to amplitude modulation, other types of interferometers, such as Michelson or Fabry-Perot interferometers, could be used.

In operation, the Mach-Zehnder interferometer shown in FIG. 1 receives the output from a single mode coherent beam source 10 such as a laser, and this output is coupled into the first fiber optic arm 12 which may be a single mode optical fiber. The light beam coupled in the fiber arm 12 is split by the input coupling means 16. The input coupling means 16 may be a 3-dB coupler/splitter (C/S) which serves to split the optical beam into the two arms 12 and 14 of the interferometer. The coupler/splitter 16 serves the same role in fiber optic interferometers as the half-silvered beam splitters in conventional interferometers. These coupler/splitters are commercially available from a variety of manufacturers.

The light beam emanates from the input coupling means 16 into both fiber arms 12 and 14. The second optical fiber arm 14 is also a single mode optical fiber and is identical in construction with the first optical fiber arm 12 and serves as a reference for the light beam propagating through the first optical fiber arm 12. Either or both of the fiber optic arms 12 and 14 may be used for sensing of a magnetic or electric field. The length of the optical fibers in each of the arms is predetermined by their intended use, but each of the fiber arms should have an optical fiber of approximately equal length to the other.

The light beam propagating through the fibers in the optical fiber arms is then recombined in the output coupling means 18, such as a second coupler/splitter where the interference of the two light beams occurs. Any modulation of the phase difference between the light propagating in the two fiber optic arms 12 and 14 is converted to an amplitude modulation at the output port 19 of the output coupling means 18. The output radiation at ports 19 is 180° out of phase with each other.

The photodetectors 20 convert the optical modulation produced by the output coupling means 18 to an electric current modulation. The electrical modulations are then combined in a differential amplifier which provides for a common mode rejection of laser amplitude noise and of optical lead noise, and can also achieve a doubling of the signal amplitude. In the application contemplated and described below, very large phase shifts are detected and thus fringe counting electronics 22, can be employed to measure the phase shifts. Suitable fringe counting electronics may be used such as the electronic design found in U.S. Pat. No. 4,603,296 to Koo et al., and especially at Column 3, fourth full paragraph.

As discussed above, magnetostrictive materials can be used to create phase modulation in the optical fibers, as is discussed in the aforementioned U.S. Pat. No, 4,603,296.

The phase modulation produced in an optical fiber attached to a magnetostrictive element has been studied and occurs in the following manner. As discussed above, the magnetostrictive element stretches or contracts the optical fiber to which it is attached in an axial direction. The axial strain produces a dimensional change in the optical fiber which in turn produces a phase change in light traveling in the fiber.

The transduction mechanism by which a fiber-optic axial strain produces a phase change in the optical path length is now discussed. The phase, $\phi$ can be expressed by the equation $$\phi = knL \qquad (2.1)$$

where $\phi$ is in radians, $k = 2\pi/\lambda_o$, $\lambda_o$ is the wavelength of light from the laser, n is the refractive index of the fiber, and L is the length of the fiber in the sensor element 12. Changes in k, n, and L result in changes in $\phi$. Mechanical forces applied to the fiber result in changes in n and L and, therefore, in $\phi$. The corresponding expression relating these changes is $$\Delta\phi = k\Delta(nL) = knL \, (\Delta n/n + \Delta L/L) \qquad (2.2)$$

where $\Delta L/L$ is the axial strain, $S_{11}$, and $\Delta n/n$ is given by $$\Delta n/n = n^2[(P_{11} + P_{12})S_{12} + P_{12}S_{11}]/2. \qquad (2.3)$$

In Eq. (2.3), $P_{11}$ and $P_{12}$ are the Pockel's coefficients, and $S_{12}$ is the radial strain.

The strains $S_{11}$ and $S_{12}$ are related by Poisson's ratio, $\mu$, through the expression $S_{12} = -\mu S_{12}$ which, when substituted along with Eq. (2.3) into Eq. (2.2) yields $$\Delta\phi = knL\,[1-(n^2/2)\,\{(1-\mu)P_{12}-\mu P_{11}\}] \quad (2.4)$$

In fused silica, a common fiber-optic material, $P_{11}=0.12$, $P_{12}=0.27$, $n=1.46$ and $\mu=0.17$. Substituting these values into Eq. (2.4) results in $$\Delta\phi = 0.796\,knLS_{11}. \quad (2.5)$$

Winding the optical fiber on a magnetostrictive cylinder results in a magnetic-field sensor. If the resulting configuration is put in a circumferentially aligned magnetic field, the magnetostrictive cylinder will respond, varying its dimensions, and straining the sensing fiber wound on it. This is the principle upon which the fiber-optic current transformer according to the present invention operates.

Pressure changes applied to the sensor arms of such a fiber-optic interferometer have been demonstrated to contribute to $S_{11}$ and thus cause phase changes in the light beam at the output coupling means 18. However, by metal jacketing the optical fiber, the pressure response is significantly reduced or eliminated. Temperature variations also effect the output signals at frequencies below 1.0 Hz. The fringe counting demodulation technique proposed herein by the inventors eliminates such temperature and pressure fluctuation problems.

In order to apply Eq. (2.5) to the design of a sensor, it is necessary to determine the expression for $S_{11}$ for the specific sensor configuration and parameter sensed. This calculation will be made for a magnetic-field sensor where the sensing element is constructed by tightly winding an optical fiber on a magnetostrictive cylinder.

Studies by others have suggested that an optical fiber could be used to measure the change in length of a magnetostrictive material subjected to a magnetic field. The resulting optical phase change was found to be linearly related to the magnetic field. The magnetooptic coupling coefficient $\phi/kLH$ of nickel was measured using a nickel cylinder around which the optical fiber in one arm of the interferometer was wound with the results described in the aforementioned article to Jarzynski et al.

Similarly data for 42-permalloy (an alloy of 42% nickel and 58% iron) has been collected by the inventors and was shown to be about 3.5 times as sensitive as nickel. The relevant theory developed below, has been compared with the magnetooptical experimental data taken both at low frequency (<1 kHz) and at higher frequency (>several tens of kHz). This study demonstrates that the piezomagnetic strain coefficient remains relatively constant from low frequency up to the frequency at which eddy currents become important.

Theoretical derivations of the important parameters contributing to the piezomagnetic strain have been carried out. Experimental techniques for obtaining the relevant parameters are described below. An expression for $S_{11}$ in Eq. (2.5) is obtained in terms of the magnetostrictive parameters, and for the magnetooptic coupling coefficient as derived in Eq. (3.5) below. This expression is used as a figure-of-merit to compare various sensors of different sensor design.

A magnetostrictive material undergoes a change in dimensions when subjected to a change in magnetic state. Except in the vicinity of the Curie temperature, these changes are essentially constant volume in nature. For slender magnetostrictive bars or thin rings, the changes in magnetic induction, B, and dimensions, S, that result from changes in magnetic field, H, and stress, T, are given by the differential relations $$dB = (\partial B/\partial H)_T dH + (\partial B/\partial T)_H dT \quad (3.1)$$

$$dS = (\partial S/\partial H)_T dH + (\partial S/\partial T)_H dT$$

where $$(\partial B/\partial H)_T = \mu_T,\ (\partial B/\partial T)_H = dT \quad (3.2)$$

$$(\partial S/\partial H)_T = dT/4,\ (\partial S/\partial T)_H = S_H.$$

$\mu$ is the permeability at constant T, $d_T$ is the effective piezomagnetic strain constant, and $S^H$ is the elastic compliance at constant H. ($S^H$ is also the reciprocal of $E_H$, the Young's modulus at constant H.)

An expression for $S_{11}$ in Eq. (2.5) above, obtained from the effective piezomagnetic strain constant, $d_T$, given by Eq. (3.2), is $$d_T = 4\pi(S_{11}/\partial H)_T. \quad (3.3)$$

The value of $d_T$ varies with dc magnetic bias. Thus, fiber-optic magnetic field sensors are generally operated with such a dc bias field; however, if properly annealed 2V-permendur (49% Co, 49% Ni, 2% V) is used, operation at remanence may be employed eliminating the need for the dc bias and the associated electrical conductor to the interferometer. Remanence is the point in a hysteresis loop where a material is fully magnetized at a magnetic field strength equal to zero, and is illustrated in FIG. 2 at 39.

Figure 2:
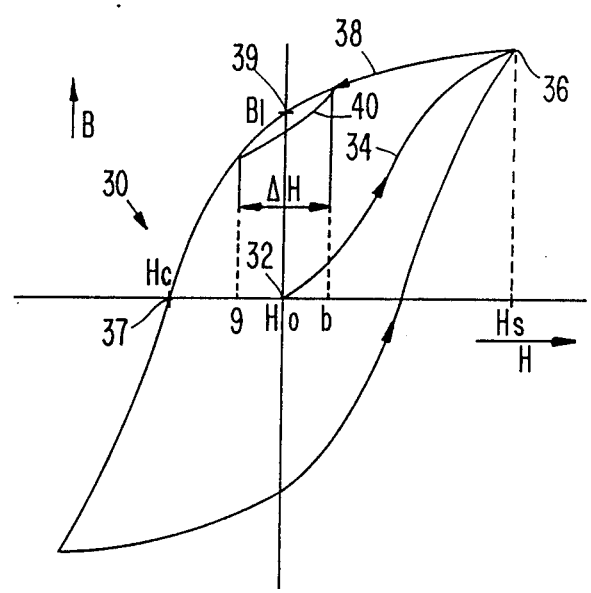
FIG. 2 is a graph representing a hysteresis curve obtained through use of a magnetostrictive element according to the present invention.

FIG. 2 shows a hysteresis loop 30 plotted on a graph having applied magnetic field H as the abscissa and induction B as the ordinate. In a non-magnetized state, and with no magnetic field present, the graph is plotted at the intersection of the axes shown by point 32.

As a uniform magnetic field H is applied, the induction B increases along line 34 to a saturation point 36. Removal of the magnetic field to a value of zero then does not return the induction of the material to zero immediately, but the material retains a remanent induction $B_r$, plotted at point 39 on the graph, the value of which is dependent on the characteristics of the material. If subsequent changes in the applied magnetic field H are maintained at a small increment $\Delta H$ relative to the magnetic field $H_s$ at the saturation point 36, a remanence hysteresis loop 40 will be traversed approximately about point 39, and the loop 40 will approximate a linear function along the upper magnetization curve 38. An exactly linear function would provide greater accuracy, but with a small enough $\Delta H$, good results can be achieved.

Now solving Eq. (3.3) for $S_{11}$ yields $$S_{11} = (\tfrac{1}{4}\pi) \int_a^b d_T dH. \quad (3.4)$$

Expressing the limits $a$ and $b$ as $-\Delta H/2$ and $+\Delta H/2$, respectively, $\Delta H$ corresponds to a small excursion about remanence, and integrating leads to the relation:

$$S_{11} = d_{To}\Delta H/4\pi. \quad (3.5)$$

For small excursions about $H_o$, $d_T$ has been taken to be a linear function of $\Delta H$ about $d_{T,o}$, where $d_{T,o}$ corresponds to its value at $H_o$. Substituting Eq. (3.5) into Eq. (2.5) and rearranging, yields the expression for the magnetooptic coupling coefficient:

$$\Delta\phi/\phi \; \Delta H = 0.796_{T,o}/4\pi \tag{3.6}$$

This quantity is a measure of the magnetooptic coupling achievable with a given magnetostrictive material. It is a function of the specific construction techniques employed and the manner in which the magnetic field is applied. In practice, the quantity $\Delta\phi/\phi \; \Delta H$ is experimentally determined for various values of $\Delta H$.

Many magnetostrictive alloys require a dc magnetic bias. This necessitates the need for an electrical conductor to provide the dc current. Since an important advantage of fiber-optic sensors such as that of the present invention, is the elimination of such conducting paths, the need for an electrical connection to the conductor is undesirable especially in the present application where high voltage environments are involved.

Figure 3:
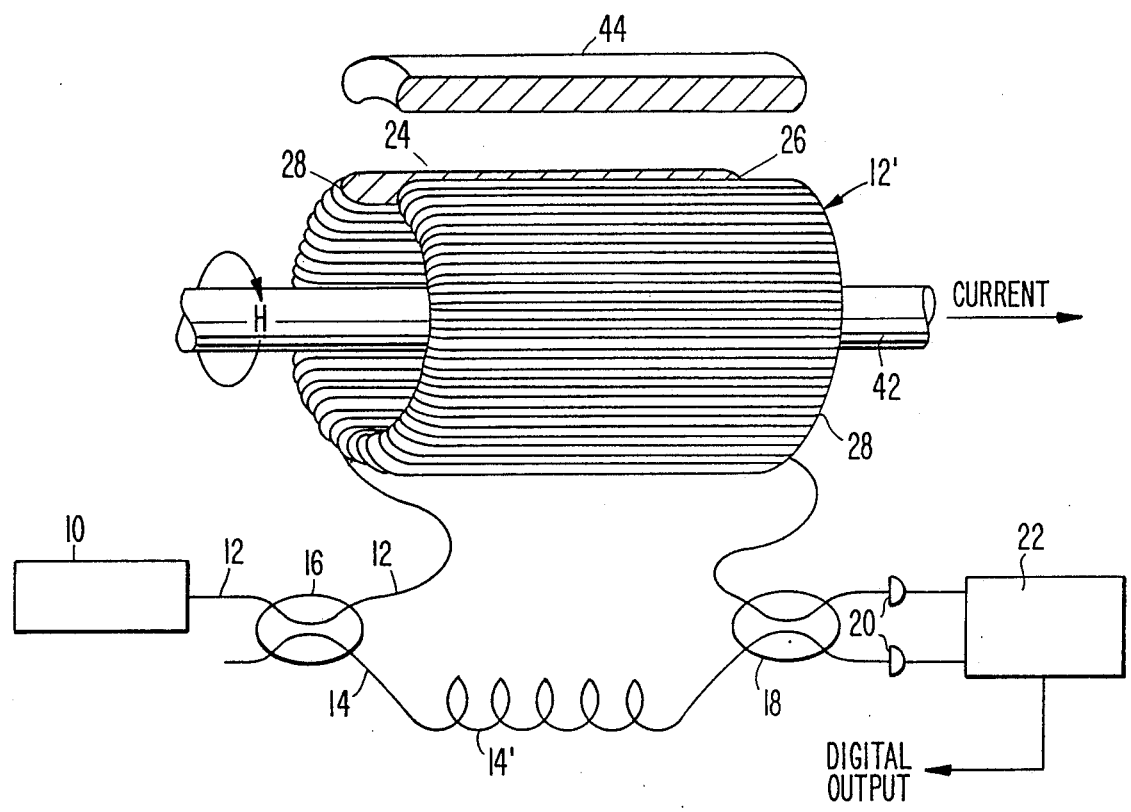
FIG. 3 is a representation of a Mach-Zehnder interferometer and includes the inventive magnetostrictive element around which the fiber optic coil is wound and a cutaway portion of the electrical conductor in which the current is flowing.
Figure 4:
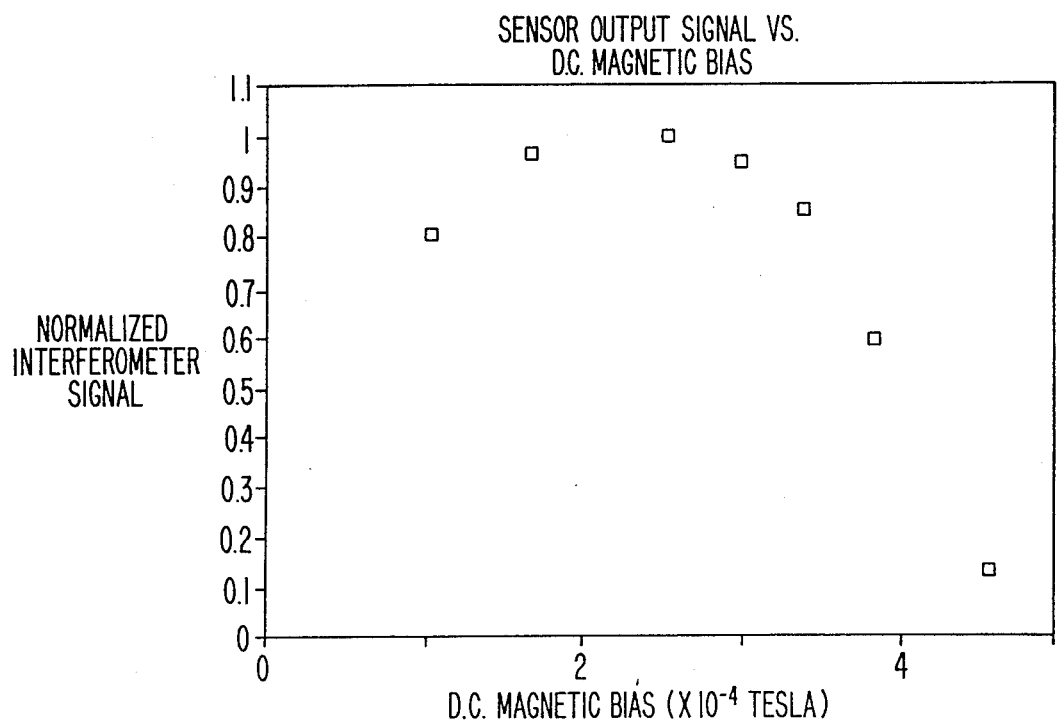
FIG. 4 is a graph representing interferometer output versus magnetic bias.

An alternate approach is the use of 2V-permendur or nickel. When properly annealed, these alloys have a sufficiently large coercive force to allow operation at remanence, as shown at element 40 of FIG. 2, thereby eliminating the need for a dc bias and thus for electrical conductors at the sensor. Coercive force is provided by the magnetic field strength which is required to bring the induction B to zero, point 37 of FIG. 2. The material of the magnetostricive element 24 of FIG. 3 is annealed so that a coercive force is large. In this case, for a 2V-permendur element, the value of $d_T = 35 \times 10^{-7}$/Oe. Substituting into Eq. (3.6), letting $\phi = knL$, and converting units yields $$\Delta\phi/L \; \Delta H = 2.45 \; (\text{radian/m.Oe}) \tag{4.1}$$

The inventors have discovered that for the contemplated application of a magnetic field sensor of the type described as a current transformer or ammeter, best results are achieved if the following techniques are used:

(a) the optical fiber is toroidally wound on a magnetostrictive cylinder in a single layer, (b) the current carrying conductor in which current is being measured passes axially through the magnetostrictive cylinder, and (c) the magnetostrictive material is operated at the magnetic remanence. For operation at remanence, hard annealed 2V-permendur (an alloy of 49% cobalt, 49% nickel, and 2% vanadium) and nickel alone have been shown to be the choice. The former exhibits a value of $d_T$ several times larger than the latter, and thus is preferable.

For the measurement of electric currents, the sensor according to the present invention can be installed without interrupting the conduction path through which the electric current flows. Such an interruption, if required, increases the electrical resistivity of the circuit as well as the probability of galvanic corrosion at the point of contact. The digital fiber-optic current transformer described below can be designed to measure a wide range of currents with an accuracy of 0.1% or better of full scale. In the embodiment discussed below, the maximum value of current is chosen to have a peak-to-peak value of approximately 10,000 amperes, but greater current values can be measured by adjusting the interferometer parameters such as the length of the fiber.

The approach used in the design of one embodiment of a current transformer according to the present invention is illustrated in FIG. 3. The sensing magnetostrictive element around which fiber loops 12 are toroidally, wound, consists of a slotted cylinder 24 of 2V-permendur substantially surrounding an axially located electrical conductor 42. The optical fiber 12 in one arm of the interferometer is toroidally wound around the cylinder 24 in the direction parallel to the conductor 42 as shown.

Once the electrical conductor is axially located, a strip 44 is cemented into slot 26 in the magnetostrictive cylinder 24. The strip 44 may be cemented or pressure bonded in slot 26, but only after conductor 42 has been passed through the slot 26 to the inside of cylinder 24. The material making up the strip 44 is partially ferromagnetic and partially nonferromagnetic. This produces demagnetizing effects that reduce the effective field to which the magnetostrictive material of cylinder 24 is subjected by a demagnetizing factor C. The demagnetizing effect can be varied over a wide range by the specific design of the cylinder 24 and strip 44 which is chosen. A quantity C equal to the demagnetizing factor is introduced into Eq. (4.1) yielding $$C\Delta\phi/L \; \Delta H = 2.45 \; (\text{radian/m.Oe}) \tag{4.2}$$

The device according to the present invention utilizes a demodulation scheme based on fringe counting. Both the value L required to achieve the specific accuracy (0.1% of full scale or less) and the number of fringes/sec to be measured are obtained using Eq. (4.1).

The maximum current passing the conductors 42 that can be measured is determined by the magnetostrictive material and the design of the sensing element 24. With regard to the former, 2V-permendur operated at remanence has been found to be optimal for large conductor currents.

One benefit derived from use of the device according to the present invention is the safety in operation. Although the device in the above described embodiment is designed to measure electric currents in the conductor up to approximately 10,000 amperes, no damage results to the device and no danger is presented to the operator or to the electrical conduction equipment if the current exceeds this value.

In operation, the electric current flowing in the conductor 42 determines the magnetic field applied to the cylinder 24. The relation between the current and the field is given by $$\Delta H(\text{amp-turns/m}) = NI/2\pi r \tag{4.3}$$

where $\Delta H$ is the peak-to-peak magnetic field, N is the number of times the conductor 42 passes through the cylinder 24 (only once in the embodiment of FIG. 3), I is the peak-to-peak current in amperes, and r is the radius of the cylinder 24 in meters. As an example, consider the following design of a current transformer. Choosing $r = 0.053$ m, and letting $I = 8000$ amps peak-to-peak, the value of $\Delta H$ becomes $2.4 \times 10^4$ amp turns/m, or 300 Oe. The effective field desired is 300 Oe peak-to-peak. Thus, the value of C, the demagnetizing factor, in Eq. (4.2) is 10.

The device thus is capable of measuring a magnetic field up to 300 Oe, but no irreversible damage occurs to the device or to the conductor 42 if a stronger magnetic field results from, for example, a transient power surge. If the magnetic field exceeds the designed 300 Oe magnetic field strength for which it is designed, no damage to the sensor occurs. In such a case, the output becomes highly nonlinear and false counts and thus incorrect conductor current values can occur, but no permanent damage results.

The device in the embodiment of FIG. 3 is designed to achieve 0.1% accuracy for the minimum current to be measured, approximately 8 amps peak-to-peak, but the minimum current may be lower depending on the design of the device. This corresponds to an effective value of $\Delta H_{min} = 0.3$ Oe peak-to-peak. For fringe counting, this value of $\Delta H_{min}$ must produce optical phase change, $\Delta \phi_{min}$, corresponding to one fringe, or $2\pi$ radians. Substituting these values into Eq. (4.2) and solving for L yields 85 m of optical fiber in fiber arms 12 and 14. Employing Eq. (4.2) once more, the value of $\Delta \phi_{max}$ corresponding to $\Delta H_{max} = 300$ Oe can be found. The resulting value of $\Delta \phi_{max}$ is 6250 radians or 1000 fringes/cycle. For an 800 Hz signal this corresponds to $8 \times 10^5$ cycles/sec. (Various frequencies are employed for power transmission. Typically, 60, 400, and 800 Hz are used. This fiber-optic current transformer according to the present invention, can be used with carrier frequencies of up to several kHz.) If the current is averaged over 10 to 100 cycles, then the accuracy can be increased by 1 or 2 orders of magnitude respectively (i.e. 0.01% and 0.001%).

Alternately, a larger safety factor can be introduced. For example, a demagnetization factor of 100 could be used in Eq. (4.2), in which case the effective peak-to-peak, magnetic field applied to the magnetostrictive cylinder would be 3.0 Oe and to achieve 0.1% accuracy it would be necessary to sum over 10 cycles.

Referring once again to FIG. 3, the preferred structure of the magnetostrictive element 24 is discussed. Optical fibers are very fragile and susceptible to damage if they are bent beyond a critical angle. Also, if a curve is introduced in an optical fiber, and the radius of curvature is not large enough, an optical beam travelling through the fiber will fail to propagate because the angle of internal reflection becomes too great, and the optical beam then becomes attenuated and dissipates. To overcome these problems, the present invention contemplates the use of rounded shoulders 28 at the longitudinal ends of the magnetostrictive element 24 to accommodate each turn 12 of the optical fiber. Furthermore, the radius of curvature of the rounded shoulders 28 is of sufficient dimensions to overcome the critical angle for each of the attenuation and fiber breakage problems.

A further consideration in the construction of the magnetostrictive element 24 is the dimensions of the slot or gap 26. Slot 26 is illustrated in FIG. 3 as being parallel to the longitudinal axis of the element 24, but a spiral slot traversing around the element 24 may be possible. One requirement, though, is that the slot 26 extend along the entire length of the cylindrical element 24, so that the electrical conductor 42 may be inserted into the inner cavity of the element 24, as is shown. Thus, another requirement is that the slot 26 be wide enough to accommodate the passage of an electrical conductor 42, such as a wire or cable, through it.

Magnetic strip 44 has been described above as partially ferromagnetic and partially non-ferromagnetic so as to produce a demagnetizing effect, and thus reduce the effective strength of the magnetic field H sensed by the element 24. The design of strip 44 is such as to complement the slotted element and thus complete the cylindrical shape of element 24 which is broken by the slot 26. Depending on the type of materials used in the construction of strip 44, the demagnetization factor C may be varied as noted above. Nickel and tin (or nickel and copper) could be used and a proportional change of the respective materials may be used to vary the demagnetization factor as desired. In place of nickel any magnetic material can be used and in place of nickel and copper any nonmagnetic material, even plastic, can be used.

FIG. 3 illustrates the magnetostrictive element 24 as being a slotted cylindrical or tubular member. A tubular element 24 having inside and outside surfaces concentric with the conductor is illustrated, as the computation of the phase changes are most easily made using such an arrangement, (see above computations). However, it is contemplated that differently shaped magnetostrictive elements 24 could be constructed and utilized, and although the computations made above would become more complex, not much difference would result in the output data received. Alternate shapes may be triangular or square tubes or even a cone shaped element.

The optical fiber of fiber arm 12 is illustrate in FIG. 3 as wound about the tubular or cylindrical element 24 in a closely separated configuration. Each turn 12, of the optical fiber is tightly wound on the inside and outside surface of the element 24, with the separation between turns being small enough to allow the approximately 85 meters of optical fiber to be wound about element 24 using only a single layer. Fiber turns 12' may be cemented onto either the inside or outside surface or element 24, or alternatively, grooves may be inscribed in rounded shoulders 28 to hold the tightly wound fiber turns 12' so as to maintain sufficient tension in the optical fiber arm 12 and be sensitive to longitudinal dimension changes.

Other alternative embodiments will be apparent to those skilled in the art. For example, the optical fiber turns 12' may be wound about and cemented to the inside surfaces of element 24 in a direction perpendicular to the longitudinal axis of element 24. Another possibility is to cement the optical fibers to only one surface of the magnetostrictive element 24 and have loops of sufficient curvature at the longitudinal ends of element 24 to allow the optical beam to propagate through the fiber.

Although the present invention has been discussed and described with primary emphasis on one preferred embodiment and method, it should be understood that various modifications can be made in the design and operation of the present invention without departing from its true spirit and full scope. The present embodiment and method are therefore to be considered in all respects as illustrative and not restrictive, the scope of the invention being indicated by the foregoing description, and all changes coming within the meaning and range of equivalency of the claims are therefore to be embraced therein.

What is claimed is:

1. A fiber optic magnetic sensor for measuring current flow in a conductor comprising:
   a magnetostrictive, hollow, elongated element having inside and outside surfaces and a longitudinal slot extending from said inside surface to said outside surface along the entire elongated dimension of said element, for the passage of an electrical conductor into the interior of the hollow element;
a beam source for producing an optical beam;
an interferometer including first and second optical fiber arms, each having a single mode optical core surrounded by cladding and first and second ends, input coupling means for coupling the optical beam produced by said beam source into said first end of each of said first and second arms, and output coupling means for coupling the optical beam at said second ends of each of said first and second arms; and
detecting means for detecting the coupled optical beam at said output coupling means whereby said first optical fiber arm is securely attached to at least one surface of said magnetostrictive, hollow, elongated element so that when said element undergoes longitudinal dimension changes related to a change in the magnetic field strength, strain is produced in said optical fiber of said first arm thus inducing strain related phase shifts in the optical beam at said output coupling means detectable by said detecting means.

2. The fiber optic magnetic sensor according to claim 1 wherein said magnetostrictive, hollow, elongated element comprises an elongated tube with said longitudinal slot extending along said longitudinal dimension substantially parallel to an axis defined by said tube.

3. The fiber optic magnetic sensor according to claim 1 wherein said first optical arm is tightly wound about said magnetostrictive element in a plurality of closely spaced turns, each turn of said optical fiber having a substantial portion extending along said magnetostrictive element in a longitudinal direction.

4. A fiber optic magnetic sensor for measuring current flow in a conductor comprising;
a magnetostrictive, hollow, elongated element having inside and outside surfaces and a longitudinal slot extending from said inside surface to said outside surface along the entire elongated dimension of said element;
a beam source for producing an optical beam;
an interferometer including first and second optical fiber arms, each having a single mode optical core surrounded by cladding and first and second ends, input coupling means for coupling the optical beam produced by said beam source into said first end of each of said first and second arms, and output coupling means for coupling the optical beam at said ends of each of said first and second arms; and
detecting means for detecting the coupled optical beam at said output coupling means whereby said first optical fiber are is securely attached to at least one surface of said magnetostrictive, hollow, elongated element so that when said element undergoes longitudinal dimension changes related to a change in the magnetic field strength, strain is produced in said optical fiber of said first arm this inducing strain related phase shifts in the optical beam at said output coupling means detectable by said detecting means,
wherein said first optical arm is tightly wound about said magnetostrictive element in a plurality of closely spaced turns, each turn of said optical fiber having a substantial portion extending along said magnetostrictive element in a longitudinal direction, and
wherein said magnetostrictive element further comprises grooved, rounded edges at each of the longitudinal ends of said element so as to adapt said magnetostrictive element to tightly stretch said optical fiber in said first fiber arm without restricting the progression of said optical beam through said fiber.

5. The fiber optic magnetic sensor according to claim 4 wherein said magnetostrictive element further comprises a slot adapted to receive a partially ferromagnetic strip having dimensions approximately complementary to the slot, so that disposing said strip into said slot complements the magnetostrictive element and a tubular assembly is formed, whereby a demagnetized factor C reduces the effective magnetic field strength sensed by said sensor.

6. The fiber optic magnetic sensor according to claim 4 wherein said slot in said magnetostrictive element is dimensioned to allow for passage of a conductor to the inside of said tube and to allow for a demagnetization factor C of approximately 10.

7. The fiber optic magnetic sensor according to claim 6 wherein each of said first and second optical fiber arms further comprise optical fibers having substantially identical lengths of approximately 85 meters so as to adapt said fiber optic magnetic sensor to measure a magnetic field corresponding to electrical currents up to approximately 10,000 amperes with an accuracy exceeding 99.9%.

8. The fiber optic magnetic sensor according to claim 7 wherein said magnetostrictive element comprises 49% nickel 49% cobalt, and 2% vanadium.

9. A sensing arm of a fiber optic interferometer for magnetic field detection comprising;
a hollow, elongated element made of magnetostrictive material having inside and outside surfaces and a longitudinal slot extending from said inside surface to said outside surface along the entire longitudinal dimension of said element, for the passage of an electrical conductor into the interior of the hollow element;
a length of optical fiber having a single mode optical core surrounding by cladding, said fiber being securely attached to said element in a direction substantially parallel to a longitudinal axis defined by said elongated dimension of said element whereby the magnetostrictive material in the presence of a magnetic field undergoes longitudinal dimension changes related to the magnetic field strength and produces strain in said optical fiber and this induces strain related phase shifts in an optical beam propagating through said fiber and whereby said slot in said hollow, elongated element produces a demagnetizing effect such that intense magnetic fields are reduced by a factor which is dependent on a radial dimension in the slot element.

10. The sensing arm according to claim 9 whereby said length of said optical fiber is approximately 85 meters, and said optical fiber is toroidally wound about said magnetostrictive element in closely spaced turns around substantially all of the surface of said element so as to be adapted to measure a magnetic field corresponding to electrical currents up to approximately 10,000 amperes with an accuracy exceeding 99.9%.

* * * * *

UNITED STATES PATENT AND TRADEMARK OFFICE
CERTIFICATE OF CORRECTION

PATENT NO. : 4,868,495

DATED : September 29, 1989

INVENTOR(S) : Robert E. Einzig; Charles M. Davis; Clarence J. Zarobila

It is certified that error appears in the above-identified patent and that said Letters Patent is hereby corrected as shown below:

Title should read "Fiber Optic Current Transformer"

Column 11, Claim 4, line 55, "are" should be --arm--.

Column 11, Claim 4, line 60, "this" should be --thus--.

Signed and Sealed this

Eleventh Day of September, 1990

Attest:

HARRY F. MANBECK, JR.

Attesting Officer     Commissioner of Patents and Trademarks